(12) United States Patent
Moon et al.

(10) Patent No.: US 11,289,535 B2
(45) Date of Patent: Mar. 29, 2022

(54) TRANSPARENT DISPLAY PANEL AND DISPLAY DEVICE INCLUDING THE SAME

(71) Applicant: Samsung Display Co., Ltd., Yongin-si (KR)

(72) Inventors: Jeongwoo Moon, Suwon-si (KR); Seong-Min Kim, Yongin-si (KR); Jinhyun Park, Yongin-si (KR); Jinkoo Chung, Suwon-si (KR); Chaungi Choi, Suwon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 15/822,822

(22) Filed: Nov. 27, 2017

(65) Prior Publication Data

US 2018/0277592 A1    Sep. 27, 2018

(30) Foreign Application Priority Data

Mar. 24, 2017  (KR) .......................... 10-2017-0037539

(51) Int. Cl.
*H01L 27/15*        (2006.01)
*H01L 27/32*        (2006.01)

(52) U.S. Cl.
CPC ........ *H01L 27/156* (2013.01); *H01L 27/3206* (2013.01); *H01L 27/3211* (2013.01); *H01L 27/3216* (2013.01); *H01L 27/322* (2013.01); *H01L 27/326* (2013.01); *H01L 27/3218* (2013.01); *H01L 2251/5323* (2013.01)

(58) Field of Classification Search
CPC ....... H01L 27/32; H01L 27/15; H01L 27/156; H01L 27/3216; H01L 27/3211; H01L 27/326; H01L 27/3218; H01L 27/322; H01L 2251/5323

USPC .................................... 257/89, 98; 345/690
See application file for complete search history.

(56) References Cited

U.S. PATENT DOCUMENTS

| 2004/0217699 A1* | 11/2004 | Haase | H01L 27/3211 313/504 |
| 2004/0257473 A1* | 12/2004 | Miyagawa | H04N 7/144 348/571 |
| 2006/0097631 A1* | 5/2006 | Lee | H01L 51/5203 313/504 |
| 2007/0114929 A1* | 5/2007 | Son | H01J 11/12 313/582 |

(Continued)

FOREIGN PATENT DOCUMENTS

| KR | 101329757 | 9/2010 |
| KR | 10-2012-0079318 A | 7/2012 |

(Continued)

OTHER PUBLICATIONS

Extended European Search Report, dated Jul. 24, 2018, 7 pages.
European Communication corresponding to European Patent Application No. 18163789.3 dated Feb. 25, 2021 7 pages.

*Primary Examiner* — Sheng-Bai Zhu

(74) *Attorney, Agent, or Firm* — Innovation Counsel LLP

(57) ABSTRACT

A transparent display panel includes a plurality of unit pixels. Each of the unit pixels includes a non-transparent region in which a first light-emitting element that generates and outputs first color light and a second light-emitting element that generates and outputs second color light are disposed and a transparent region in which a third light-emitting element that generates and outputs third color light is disposed.

18 Claims, 12 Drawing Sheets

(56) References Cited

U.S. PATENT DOCUMENTS

| | | | | |
|---|---|---|---|---|
| 2011/0205198 A1* | 8/2011 | Jeong | ............... | H01L 27/326 |
| | | | | 345/205 |
| 2011/0260148 A1* | 10/2011 | Lee | ............... | H01L 51/5262 |
| | | | | 257/40 |
| 2012/0037305 A1* | 2/2012 | Yamashita | ............ | G02B 5/223 |
| | | | | 156/247 |
| 2012/0074435 A1* | 3/2012 | Ha | ............... | H01L 51/5203 |
| | | | | 257/88 |
| 2013/0113843 A1* | 5/2013 | Yamazaki | ............ | H01L 27/326 |
| | | | | 345/690 |
| 2013/0207099 A1 | 8/2013 | Shu et al. | | |
| 2013/0334547 A1* | 12/2013 | Yoneda | ............... | H01L 33/24 |
| | | | | 257/89 |
| 2014/0225815 A1* | 8/2014 | Jung | ............... | G09G 5/02 |
| | | | | 345/83 |
| 2015/0028298 A1* | 1/2015 | Chung | ............... | H01L 51/5203 |
| | | | | 257/40 |
| 2015/0102306 A1 | 4/2015 | Shi et al. | | |
| 2016/0093250 A1 | 3/2016 | Lee | | |

FOREIGN PATENT DOCUMENTS

| | | |
|---|---|---|
| KR | 101275810 | 6/2013 |
| KR | 101223727 | 11/2013 |
| KR | 1020150011694 | 2/2015 |
| KR | 10-2015-0050318 A | 5/2015 |
| KR | 10-2017-0027362 A | 3/2017 |

\* cited by examiner

TRANSPARENT DISPLAY PANEL AND DISPLAY DEVICE INCLUDING THE SAME

CROSS-REFERENCE TO RELATED APPLICATION(S)

This application claims priority under 35 USC § 119 to Korean Patent Application No. 10-2017-0037539, filed on Mar. 24, 2017 in the Korean Intellectual Property Office (KIPO), the disclosure of which is incorporated herein in its entirety by reference.

BACKGROUND

1. Technical Field

Example embodiments relate generally to a display device. More particularly, embodiments of the present inventive concept relate to a transparent display panel in which each pixel includes a transparent region and a non-transparent region and a display device including the transparent display panel.

2. Description of the Related Art

There is a rising interest on a display device including a transparent display panel that allows a user to see an object located behind the transparent display panel as well as visual information displayed on the transparent display panel. Such transparent display panel can be used for a variety of applications, for example, a car window, a show window, a building window, etc. Generally, a transparent display panel includes a plurality of unit pixels, and each of the unit pixels includes a transparent region through which light passes and a non-transparent region in which at least one light-emitting element is disposed. Thus, the transparent display panel displays the visual information (i.e., a displayed image) based on the light emitted from the light-emitting element disposed in the non-transparent region and allows the user to see an object located behind the transparent display panel through the transparent region.

However, as the number of the light-emitting elements increases and so does the resolution of the transparent display panel, an area of the non-transparent region may increase, and an area of the transparent region may decrease. As a result, transparency (or transmittance) of the transparent display panel may deteriorate. On the other hand, when the area of the transparent region is maintained to maintain the transparency of the transparent display panel, the area of the non-transparent region may decrease, and an area of the light-emitting element disposed in the non-transparent region may decrease. As a result, luminance of the image displayed on the transparent display panel may deteriorate. In other words, a conventional transparent display panel that is manufactured to have a high resolution may exhibit degraded transparency and/or luminance.

SUMMARY

Some example embodiments provide a transparent display panel that can be manufactured to have a high resolution without degradation of transparency and/or luminance of the transparent display panel.

Some example embodiments provide a display device including the transparent display panel that can display a high-quality image on the transparent display panel.

According to an aspect of example embodiments, a transparent display panel may include a plurality of unit pixels. Each of the unit pixels may include a non-transparent region in which a first light-emitting element that generates and outputs first color light and a second light-emitting element that generates and outputs second color light are disposed, and a transparent region in which a third light-emitting element that generates and outputs third color light is disposed.

In example embodiments, each of the first light-emitting element, the second light-emitting element, and the third light-emitting element may include an organic light emitting diode.

In example embodiments, an anode and a cathode of the third light-emitting element may be a transparent electrode.

In example embodiments, an anode of the first light-emitting element and an anode of the second light-emitting element may be a non-transparent electrode, a semi-transparent electrode, the transparent electrode, or a reflective electrode. In addition, a cathode of the first light-emitting element and a cathode of the second light-emitting element may be the non-transparent electrode, the semi-transparent electrode, or the transparent electrode.

In example embodiments, an anode of the first light-emitting element and an anode of the second light-emitting element may be a non-transparent electrode, a semi-transparent electrode, or the transparent electrode. In addition, a cathode of the first light-emitting element and a cathode of the second light-emitting element may be the non-transparent electrode, the semi-transparent electrode, the transparent electrode, or a reflective electrode.

In example embodiments, an area of the transparent region may be larger than an area of the non-transparent region.

In example embodiments, an area of the third light-emitting element may be equal to the area of the transparent region.

In example embodiments, an area of the third light-emitting element may be larger than an area of the first light-emitting element and an area of the second light-emitting element.

In example embodiments, an organic layer of the third light-emitting element may be thinner than an organic layer of the first light-emitting element and an organic layer of the second light-emitting element.

In example embodiments, the third color light may be blue light, the first color light may be red light, and the second color light may be green light.

In example embodiments, the third color light may be red light, the first color light may be blue light, and the second color light may be green light.

In example embodiments, the third color light may be green light, the first color light may be blue light, and the second color light may be red light.

In example embodiments, a circuit structure connected to the third light-emitting element may include a transparent transistor and a transparent wiring. In addition, the circuit structure connected to the third light-emitting element may be disposed in the transparent region or in the non-transparent region.

In example embodiments, a circuit structure connected to the third light-emitting element may include a non-transparent transistor and a non-transparent wiring. In addition, the circuit structure connected to the third light-emitting element may be disposed in the non-transparent region.

In example embodiments, a black matrix may be disposed over a non-element region of the non-transparent region other than an element region of the non-transparent region in which the first light-emitting element and the second light-emitting element are disposed.

In example embodiments, a color filter may be disposed over an element region of the non-transparent region in which the first light-emitting element and the second light-emitting element are disposed.

In example embodiments, a color filter may be disposed over an element region of the non-transparent region in which the first light-emitting element and the second light-emitting element are disposed. In addition, a black matrix may be disposed over a non-element region of the non-transparent region other than the element region of the non-transparent region.

In example embodiments, the first light-emitting element may be disposed at a side of the third light-emitting element in a first direction. In addition, the second light-emitting element may be disposed at a side of the third light-emitting element in a second direction that is perpendicular to the first direction.

In example embodiments, the first light-emitting element and the second light-emitting element may be disposed together at a side of the third light-emitting element or may be disposed respectively at opposite sides of the third light-emitting element.

According to an aspect of example embodiments, a display device may include a transparent display panel including a plurality of unit pixels and a panel driving circuit configured to drive the transparent display panel. Each of the unit pixels may include a non-transparent region in which a first light-emitting element that generates and outputs first color light and a second light-emitting element that generates and outputs second color light are disposed, and a transparent region in which a third light-emitting element that generates and outputs third color light is disposed.

The transparent display panel according to example embodiments may be manufactured to have a high resolution while achieving high transparency and high luminance by including unit pixels each having a structure in which only one light-emitting element is disposed (or integrated) in a transparent region, where each of the unit pixels includes a non-transparent region in which a first light-emitting element that generates and outputs first color light and a second light-emitting element that generates and outputs second color light are disposed and the transparent region in which a third light-emitting element that generates and outputs third color light is disposed.

In addition, a display device according to example embodiments may provide a user with a high-quality image by including the transparent display panel.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Hereinafter, embodiments of the present inventive concept will be explained in detail with reference to the accompanying drawings.

Figure 1:
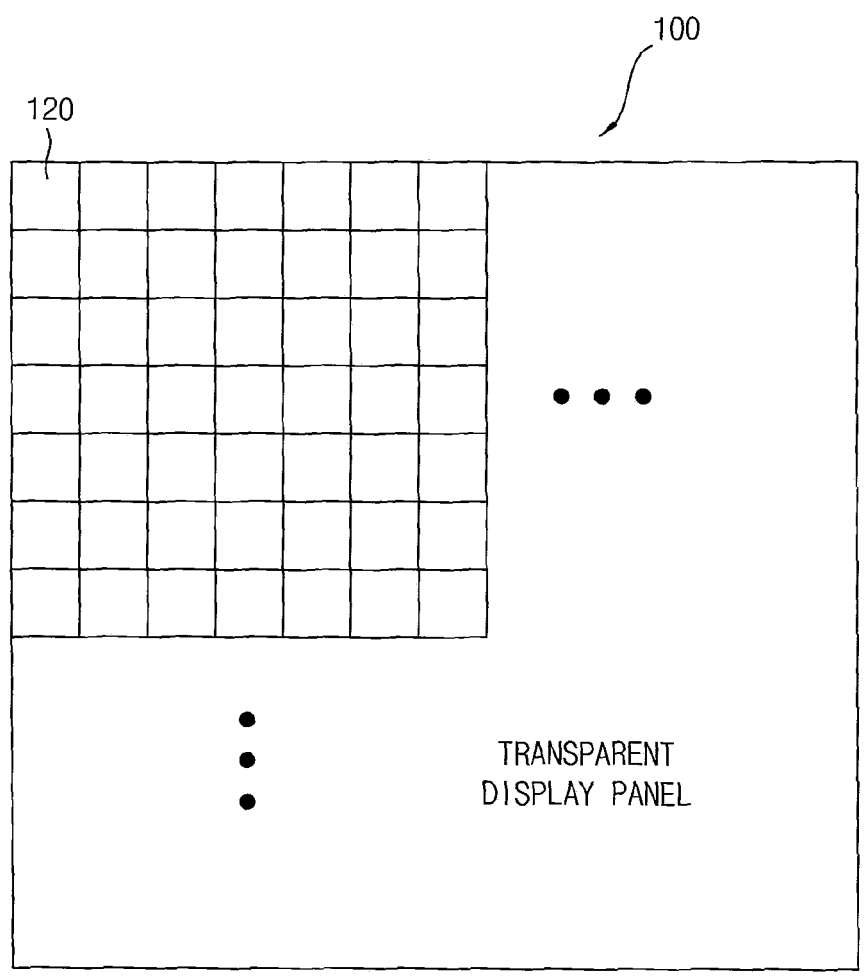
FIG. 1 is a diagram illustrating a transparent display panel, according to an example embodiment.
Figure 2:
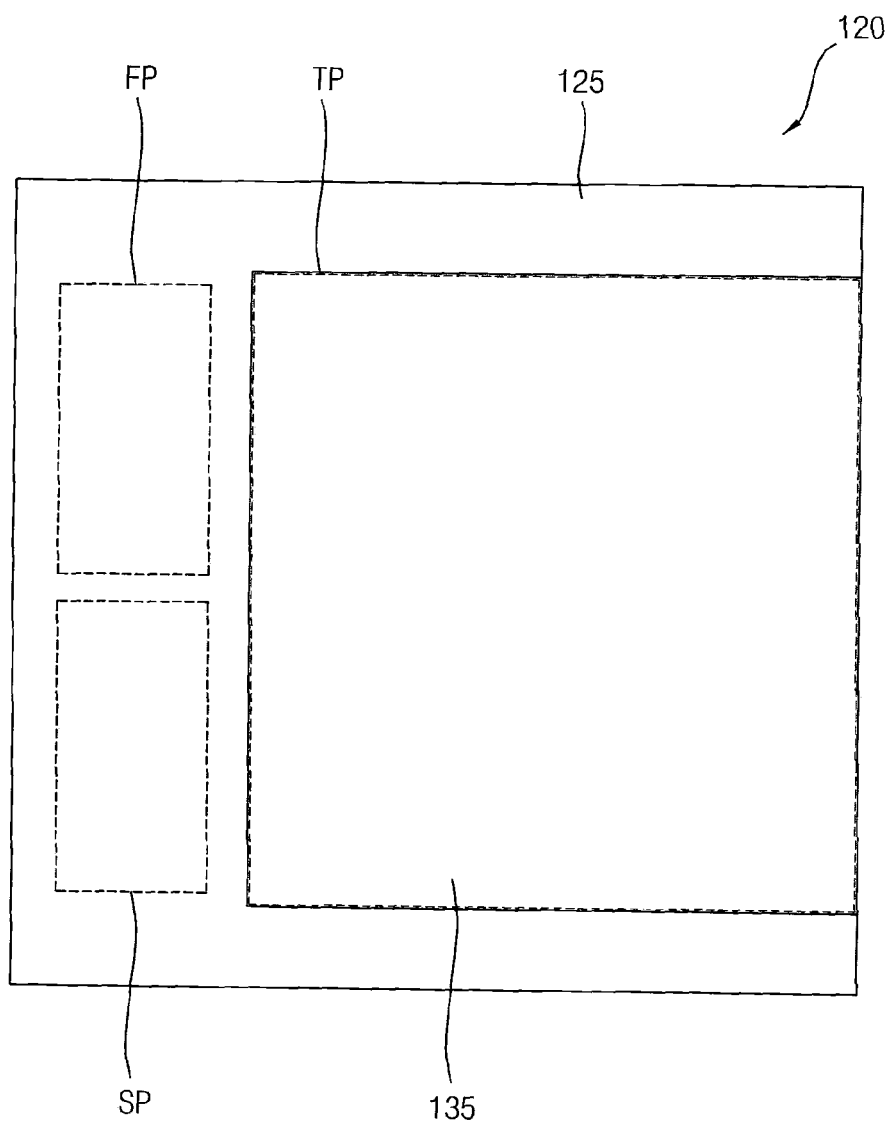
FIG. 2 is a diagram illustrating an example of a unit pixel included in the transparent display panel of FIG. 1.
Figure 3:
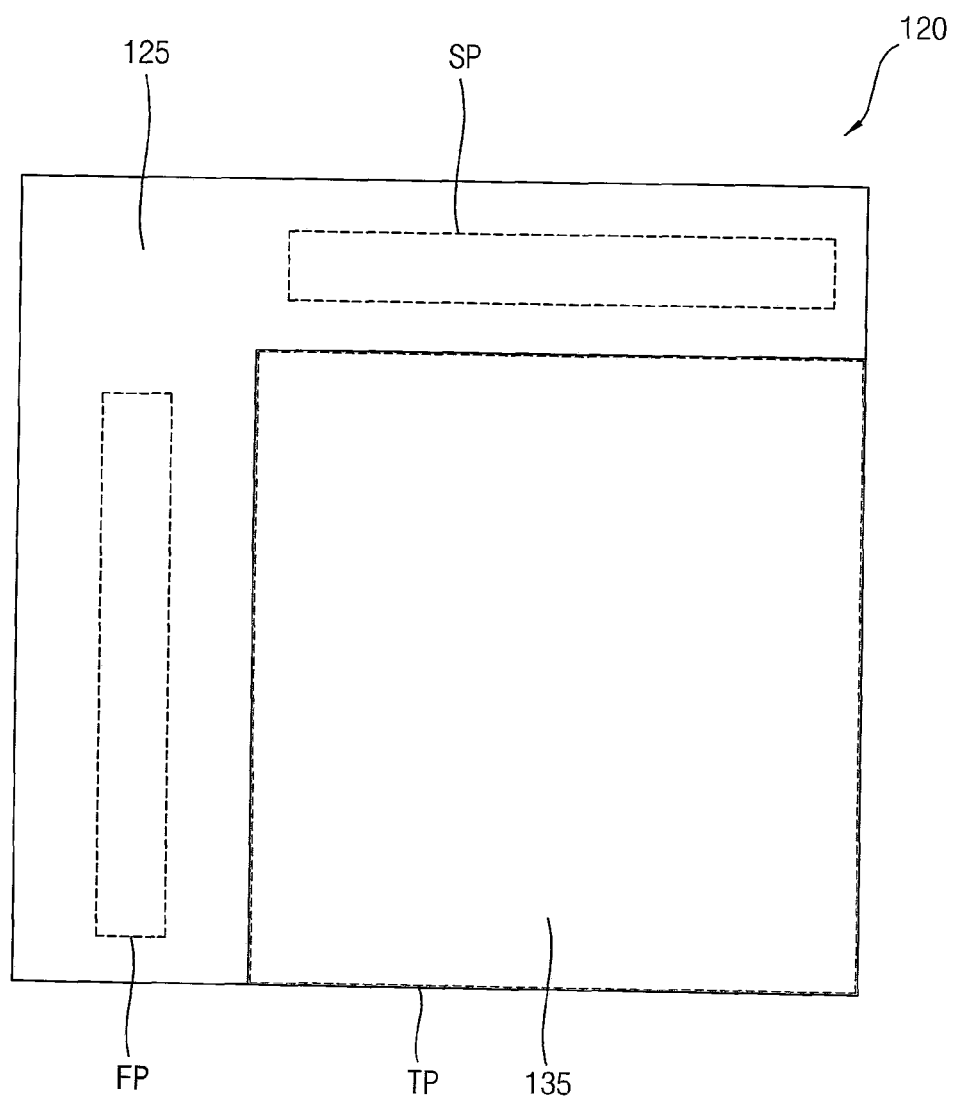
FIG. 3 is a diagram illustrating another example of a unit pixel included in the transparent display panel of FIG. 1.
Figure 4:
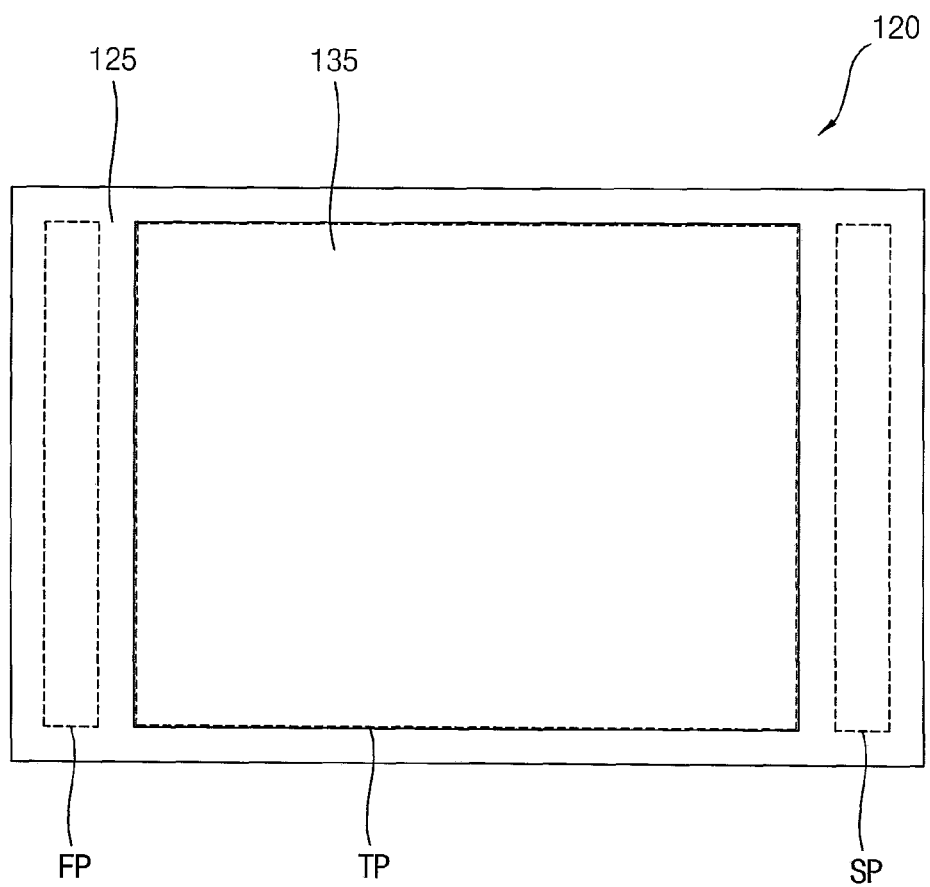
FIG. 4 is a diagram illustrating still another example of a unit pixel included in the transparent display panel of FIG. 1.

FIG. 1 is a diagram illustrating a transparent display panel, according to an example embodiment. FIG. 2 is a diagram illustrating an example of a unit pixel included in the transparent display panel of FIG. 1. FIG. 3 is a diagram illustrating another example of a unit pixel included in the transparent display panel of FIG. 1. FIG. 4 is a diagram illustrating still another example of a unit pixel included in the transparent display panel of FIG. 1.

Referring to FIGS. 1 through 4, the transparent display panel 100 may include a plurality of unit pixels 120, and each of the unit pixels 120 may include a non-transparent region 125 and a transparent region 135. For example, the transparent display panel 100 may be an organic light emitting display panel. However, it is noted that the transparent display panel 100 is not limited to the example, and the transparent display panel 100 may be other types of display panels including a transparent region and a non-transparent region without deviating from the scope of the present disclosure.

A first light-emitting element FP that generates and outputs first color light and a second light-emitting element SP that generates and outputs second color light may be disposed (or formed) in the non-transparent region 125. A third light-emitting element TP that generates and outputs third color light may be disposed in the transparent region 135. For example, the non-transparent region 125 may be manufactured to have transparency of less than 5%, and the transparent region 135 may be manufactured to have transparency of more than 70%. However, transparencies of the non-transparent region 125 and the transparent region 135 are not limited to the example. In an example embodiment, each of the first light-emitting element FP, the second light-emitting element SP, and the third light-emitting element TP may include an organic light emitting diode.

Since a unit pixel included in a conventional transparent display panel has a structure in which a light-emitting element is disposed in only a non-transparent region (i.e., the light-emitting element is not disposed in a transparent region), the conventional transparent display panel displays an image based on light output from the light-emitting element disposed in the non-transparent region. As a result, only the transparent region of the conventional transparent display panel allows the user to see an object located behind the conventional transparent display panel. In other words, the transparent region of the conventional transparent display panel only acts as a window through which the light passes.

However, the unit pixel 120 of the transparent display panel 100 may include the transparent region 135 and the non-transparent region 125 and may have a structure in which a light-emitting element is disposed in the transparent region 135 as well as the non-transparent region 125. In the present example, only one light-emitting element (i.e., the third light-emitting element TP) may be disposed in the transparent region 135. In other words, the transparent display panel 100 may include the unit pixel 120 having a structure in which only one light-emitting element is disposed (or integrated) in the transparent region 135. Thus, the transparent region 135 may allow the user to see an object located behind the transparent display panel 100 acting as a window through which the light passes. In addition, the transparent panel 100 may display an image based on the third color light output from the third light-emitting element TP disposed in the transparent region 135 in conjunction with the first color light output from the first light-emitting element FP disposed in the non-transparent region 125 and the second color light output from the second light-emitting element SP disposed in the non-transparent region 125.

Referring to FIG. 2, one light-emitting element having a complete shape (i.e., the third light-emitting element TP) may be disposed in the transparent region 135. If two or more light-emitting elements are disposed in the transparent region 135, the transparent region 135 may be divided by the two or more light-emitting elements. In addition, if one light-emitting element is disposed across the non-transparent region 125 and the transparent region 135, the light-emitting element may need to satisfy characteristics of both the non-transparent region 125 and the transparent region 135.

For example, if two or more light-emitting elements are disposed in the transparent region 135, a transparent layer for separating the two or more light-emitting elements disposed in the transparent region 135 (e.g., a pixel defining layer) may absorb light in a specific wavelength band (i.e., show color corresponding to the specific wavelength), and/or an inclined plane of the transparent layer may refract the light passing through the transparent region 135. In addition, if a non-transparent layer is used for separating the two or more light-emitting elements disposed in the transparent region 135, the non-transparent layer may be observed as window bars, and/or the light passing through the transparent region 135 may be refracted by the non-transparent layer. Thus, haze-increasing (i.e., sharpness-degradation) and transparency-degradation may be caused in the transparent display panel 100.

For example, if one light-emitting element is disposed across the non-transparent region 125 and the transparent region 135, a transparent electrode may be used even in the non-transparent region 125 because it is undesirable to use a non-transparent electrode as an anode and a cathode of the light-emitting element in the transparent region 135.

In the present example, since the light passes through the transparent region 135, electrodes (i.e., the anode and the cathode) of the third light-emitting element TP may be a transparent electrode. On the other hand, since the light does not pass through the non-transparent region 125, the anode of the first light-emitting element FP and the anode of the second light-emitting element SP may be a non-transparent electrode, a semi-transparent electrode, a transparent electrode, or a reflective electrode, and the cathode of the first light-emitting element FP and the cathode of the second light-emitting element SP may be a non-transparent electrode, a semi-transparent electrode, or a transparent electrode. Alternatively, the anode of the first light-emitting element FP and the anode of the second light-emitting element SP may be a non-transparent electrode, a semi-transparent electrode, or a transparent electrode, and the cathode of the first light-emitting element FP and the cathode of the second light-emitting element SP may be a non-transparent electrode, a semi-transparent electrode, a transparent electrode, or a reflective electrode. For example, when the anodes or the cathodes of the first and second light-emitting elements FP and SP are a reflective electrode, the first and second light-emitting elements FP and SP may have an internal resonance structure. For example, the transparent electrode may refer to an electrode having transparency of more than 90%, the non-transparent electrode may refer to an electrode having transparency of less than 1%, and the semi-transparent electrode may refer to an electrode having transparency between 1% and 90%. However, the transparent electrode, the non-transparent electrode, and the semi-transparent electrode are not limited to these examples, and the ranges of the transparency for the transparent electrode, the non-transparent electrode, and the semi-transparent electrode may vary without deviating from the scope of the present disclosure. In other words, it should be understood that the transparency of the transparent electrode, the non-transparent electrode, and the semi-transparent electrode is relative to one another.

The third light-emitting element TP disposed in the transparent region 135 may be connected to the circuit structure that drives the third light-emitting element TP. Specifically, the circuit structure may include a transistor (e.g., a switching transistor and a driving transistor) and a wiring. The third light-emitting element TP may emit light based on a current that is controlled by the circuit structure (i.e., the driving transistor included in the circuit structure). As described above, since the light passes through the transparent region 135, the electrodes of the third light-emitting element TP may be a transparent electrode. In an example embodiment, the circuit structure connected to the third light-emitting element TP may include a transparent transistor and a transparent wiring. In this case, since the circuit structure connected to the third light-emitting element TP is transparent (i.e., the light passes through the circuit structure), the circuit structure connected to the third light-emitting element TP may be disposed in the transparent region 135 or may be disposed in the non-transparent region 125. For example, the circuit structure connected to the third light-emitting element TP may be disposed under the third light-emitting element TP, may be disposed under the first light-emitting element FP and/or the second light-emitting element SP, or may be disposed in a non-element region of the non-transparent region 125 other than the element region of the non-transparent region 125 in which the first and second light-emitting elements FP and SP are disposed.

In another example embodiment, the circuit structure connected to the third light-emitting element TP may include a non-transparent transistor and a non-transparent wiring. In this case, if the circuit structure connected to the third light-emitting element TP is disposed in the transparent region 135, the non-transparent transistor and the non-transparent wiring may be observed in the transparent region 135. Thus, the circuit structure connected to the third light-emitting element TP may be disposed in the non-transparent region 125. For example, the circuit structure connected to the third light-emitting element TP may be disposed under the first light-emitting element FP and/or the second light-emitting element SP or may be disposed in the non-element region of the non-transparent region 125 other than the element region of the non-transparent region 125 in which the first and second light-emitting elements FP and SP are disposed.

In an example embodiment, an area of the transparent region 135 may be larger than an area of the non-transparent region 125. In a conventional transparent display panel, three light-emitting elements are disposed in the non-transparent region of each unit pixel. In the transparent display panel 100, only two light-emitting elements (i.e., the first light-emitting element FP and the second light-emitting element SP) may be disposed in the non-transparent region 125 of each unit pixel 120. Thus, the area of the non-transparent region 125 of each unit pixel 120 included in the transparent display panel 100 may be decreased as compared to the area of the non-transparent region of each unit pixel included in the conventional transparent display panel. In addition, the area of the transparent region 135 of each unit pixel 120 included in the transparent display panel 100 may be increased as compared to the area of the transparent region of each unit pixel included in the conventional transparent display panel. As a result, the area of the transparent region 135 may be larger than the area of the non-transparent region 125 in the transparent display panel 100, and thus the transparency of the transparent display panel 100 may be increased or improved.

In an example embodiment, an area of the third light-emitting element TP may be substantially equal to the area of the transparent region 135. If the area of the third light-emitting element TP is smaller than the area of the transparent region 135, a layer such as the pixel defining layer of the third light-emitting element TP may be observed in the transparent region 135, and/or light refraction or light diffraction may be caused by the layer. Thus, the third light-emitting element TP may be manufactured to have an area that is substantially equal to the area of the transparent region 135. In some example embodiments, the area of the third light-emitting element TP may be smaller than the area of the transparent region 135.

In an example embodiment, the area of the third light-emitting element TP may be larger than an area of the first light-emitting element FP and an area of the second light-emitting element SP. For example, the third light-emitting element TP disposed in the transparent region 135 may have relatively low light-emitting efficiency as compared to the first light-emitting element FP and the second light-emitting element SP disposed in the non-transparent region 125 due to structural constraints or structural limitations of the transparent region 135. Thus, the third light-emitting element TP may compensate for the relatively low light-emitting efficiency by having an area that is larger than the area of the first light-emitting element FP and the area of the second light-emitting element SP. Further, in some example embodiments, the area of the third light-emitting element TP may be larger than the sum of the area of the first light-emitting element FP and the area of the second light-emitting element SP.

In an example embodiment, as illustrated in FIG. 2, the first light-emitting element FP and the second light-emitting element SP may be disposed together at a left side or a right side of the third light-emitting element TP in a first direction (e.g., a horizontal direction). Alternatively, although it is not illustrated, the first light-emitting element FP and the second light-emitting element SP may be disposed together at an upper side or a lower side of the third light-emitting element TP in a second direction (e.g., a vertical direction) that is perpendicular to the first direction.

In another example embodiment, as illustrated in FIG. 3, the first light-emitting element FP may be disposed at a left side or a right side of the third light-emitting element TP in a first direction (e.g., a horizontal direction), and the second light-emitting element SP may be disposed at an upper side or a lower side of the third light-emitting element TP in a second direction (e.g., a vertical direction) that is perpendicular to the first direction. In still another example embodiment, as illustrated in FIG. 4, the first light-emitting element FP and the second light-emitting element SP may be disposed respectively at opposite sides (e.g., a left side and a right side) of the third light-emitting element TP in a first direction (e.g., a horizontal direction). Alternatively, as although it is not illustrated, the first light-emitting element FP and the second light-emitting element SP may be disposed respectively at opposite sides (e.g., an upper side and a lower side) of the third light-emitting element TP in a second direction (e.g., a vertical direction) that is perpendicular to the first direction.

Each unit pixel 120 included in the transparent display panel 100 may include a red light-emitting element that emits red light, a blue light-emitting element that emits blue light, and a green light-emitting element that emits green light. In an example embodiment, the third color light output from the third light-emitting element TP may be the blue light, the first color light output from the first light-emitting element FP may be the red light, and the second color light output from the second light-emitting element SP may be the green light. In another example embodiment, the third color light output from the third light-emitting element TP may be the green light, the first color light output from the first light-emitting element FP may be the blue light, and the second color light output from the second light-emitting element SP may be the red light. In still another example embodiment, the third color light output from the third light-emitting element TP may be the red light, the first color light output from the first light-emitting element FP may be the blue light, and the second color light output from the second light-emitting element SP may be the green light. Because the red light-emitting element has relatively high light-emitting efficiency, the above example embodiment in which the third light-emitting element TP disposed in the transparent region 135 having the structural constraints is the red light-emitting element may be used for saving power consumption and achieving efficient color changes.

In brief, the transparent display panel 100 may be manufactured to have a high resolution while achieving high transparency and high luminance by including the unit pixels 120 each having a structure in which only one light-emitting element (i.e., the third light-emitting element TP) is disposed in the transparent region 135. Each of the unit pixels 120 includes the non-transparent region 125 in which the first light-emitting element FP that generates and outputs the first color light and the second light-emitting element SP that generates and outputs the second color light are disposed and the transparent region 135 in which the third light-emitting element TP that generates and outputs the third color light is disposed. In other words, the transparent display panel 100 may reduce the area of the non-transparent region 125 without luminance degradation and may improve the transparency by increasing the area of the transparent region 135 by an amount of the decreased area of the non-transparent region 125. Thus, the transparent display panel 100 may have advantages in being manufactured to have a high resolution as compared to a conventional transparent display panel. As a result, a display device which includes the transparent display panel 100 may display a high-quality image on the transparent display panel 100.

In some example embodiments, a thickness of an organic layer included in the third light-emitting element TP may be different from a thickness of an organic layer included in the first light-emitting element FP and a thickness of an organic layer included in the second light-emitting element SP. For example, the organic layer of the third light-emitting element TP may be thinner than the organic layer of the first light-emitting element FP and the organic layer of the second light-emitting element SP. In some example embodiments, a color filter (CF) and/or a black matrix (BM) for preventing or reducing the light from passing through the non-transparent region 125 may be disposed over the non-transparent region 125 in the unit pixel 120. Example embodiments relating to the color filter and/or the black matrix will be described in detail with reference to FIGS. 5 through 7C.

Figure 5:
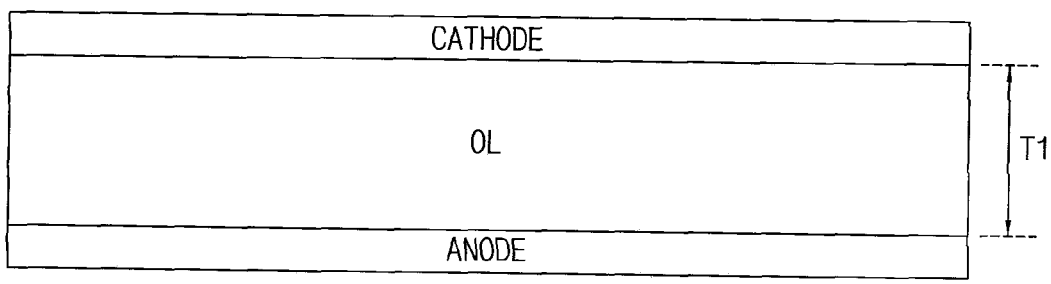
FIG. 5 is a diagram illustrating a structure of first and second light-emitting elements disposed in a non-transparent region of a unit pixel included in the transparent display panel of FIG. 1.
Figure 6:
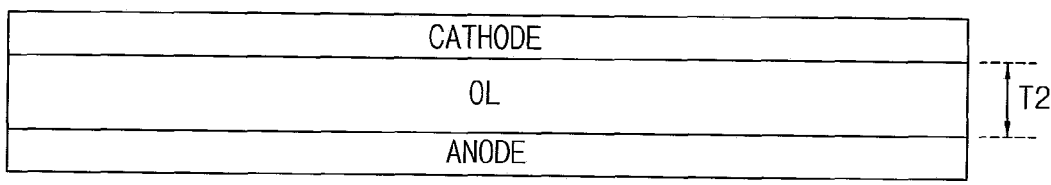
FIG. 6 is a diagram illustrating a structure of a third light-emitting element disposed in a transparent region of a unit pixel included in the transparent display panel of FIG. 1.

FIG. 5 is a diagram illustrating a structure of first and second light-emitting elements disposed in a non-transparent region of a unit pixel included in the transparent display panel of FIG. 1. FIG. 6 is a diagram illustrating a structure of a third light-emitting element disposed in a transparent region of a unit pixel included in the transparent display panel of FIG. 1.

Referring to FIGS. 5 and 6, each of the first through third light-emitting elements may include an anode ANODE, a cathode CATHODE, and an organic layer OL that is disposed between the anode ANODE and the cathode CATHODE. Here, the organic layer OL may include a hole injection layer, a hole transport layer, an emission layer, an electron transport layer, and an electron injection layer.

As illustrated in FIG. 5, each of the first and second light-emitting elements disposed in the non-transparent region 125 may include the anode ANODE, the organic layer OL, and the cathode CATHODE. Here, since light does not pass through the non-transparent region 125 in each unit pixel 120, the anode ANODE and the cathode CATHODE of the first light-emitting element and the anode ANODE and the cathode CATHODE of the second light-emitting element may be at least one electrode selected from a non-transparent electrode, a semi-transparent electrode, a transparent electrode, and a reflective electrode. For example, when the anodes ANODE of the first and second light-emitting elements are the reflective electrode, the first and second light-emitting elements may have an internal resonance structure, and thus may achieve relatively high light-emitting efficiency as compared to the third light-emitting element.

As illustrated in FIG. 6, the third light-emitting element disposed in the transparent region 135 may include the anode ANODE, the organic layer OL, and the cathode CATHODE. Here, since light passes through the transparent region 135 in each unit pixel 120, the anode ANODE and the cathode CATHODE of the third light-emitting element may be a transparent electrode. In other words, the third light-emitting element may have an internal non-resonance structure, and thus may achieve relatively low light-emitting efficiency as compared to the first and second light-emitting elements.

In addition, as illustrated in FIGS. 5 and 6, although the third light-emitting element is manufactured with transparent materials in the transparent region 135 of each unit pixel 120, transparency of the transparent region 135 may be degraded (or lowered) as compared to transparency of a conventional transparent region in which no light-emitting element is disposed. Thus, the thickness T2 of the organic layer OL of the third light-emitting element may be less than the thickness T1 of the organic layer OL of the first light-emitting element and the organic layer OL of the second light-emitting element. That is, transparency-degradation of the transparent display panel 100 may be minimized by reducing the thickness T2 of the organic layer OL of the third light-emitting element. Therefore, the organic layer OL of the third light-emitting element may be thinner than the organic layer OL of the first light-emitting element and the second light-emitting element, and the third light-emitting element may have relatively low light-emitting efficiency as compared to the first light-emitting element and the second light-emitting element.

To compensate for the relatively low light-emitting efficiency of the third light-emitting element, an area of the third light-emitting element may be larger than an area of the first light-emitting element and an area of the second light-emitting element in each unit pixel 120. In this case, the third light-emitting element may achieve the light-emitting efficiency that is similar to the light-emitting efficiency of the first light-emitting element and the second light-emitting element. Power consumption for driving the third light-emitting element is greater than power consumption for driving the first light-emitting element and the second light-emitting element because the area of the third light-emitting element is larger than the area of the first light-emitting element and the second light-emitting element. Therefore, it may be desirable to configure the third light-emitting element disposed in the transparent region 135 to be the red light-emitting element having relatively high light-emitting efficiency.

Figure 7A:
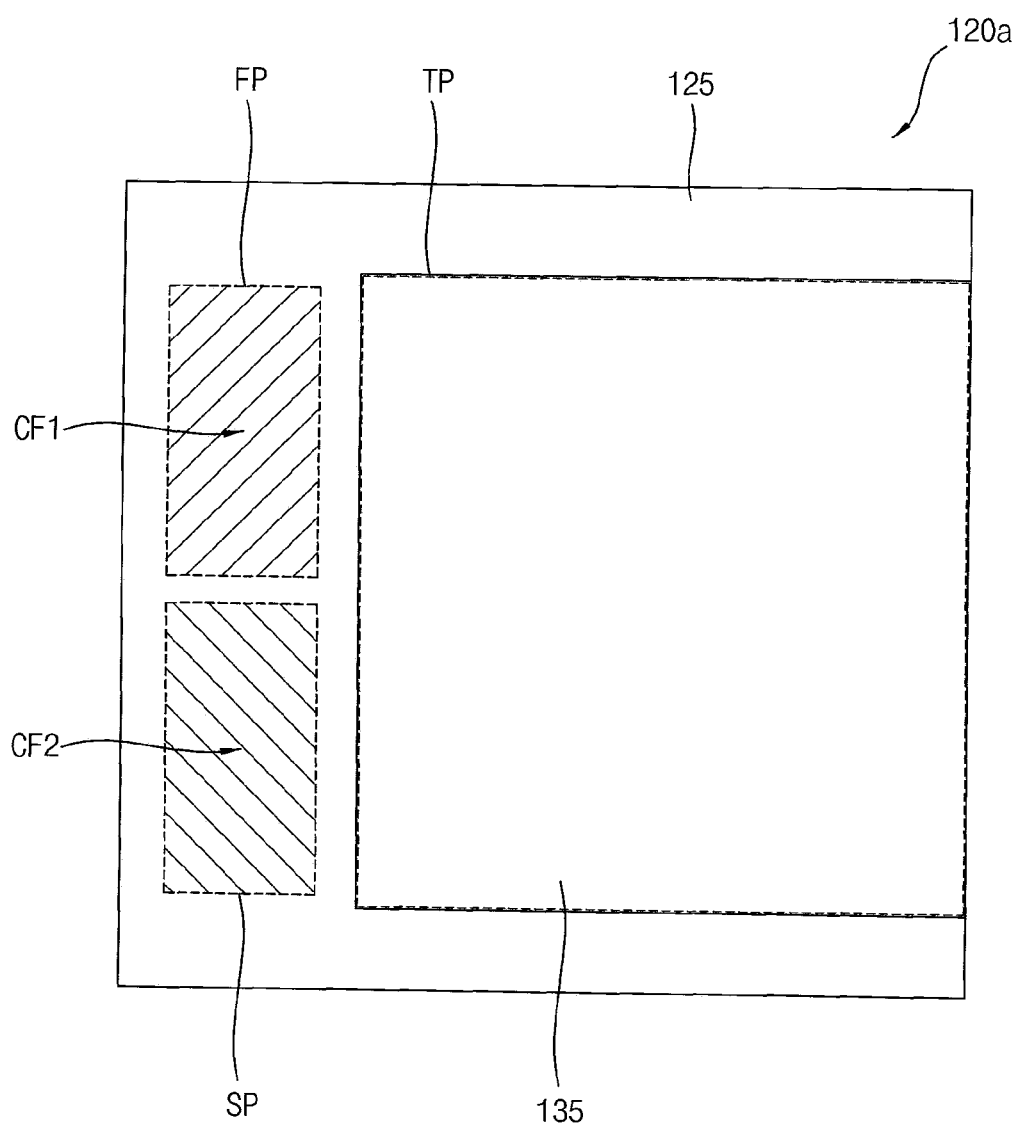
FIGS. 7A through 7C are diagrams illustrating examples in which a color filter and/or a black matrix are disposed on a non-transparent region of a unit pixel included in the transparent display panel of FIG. 1.
Figure 7B:
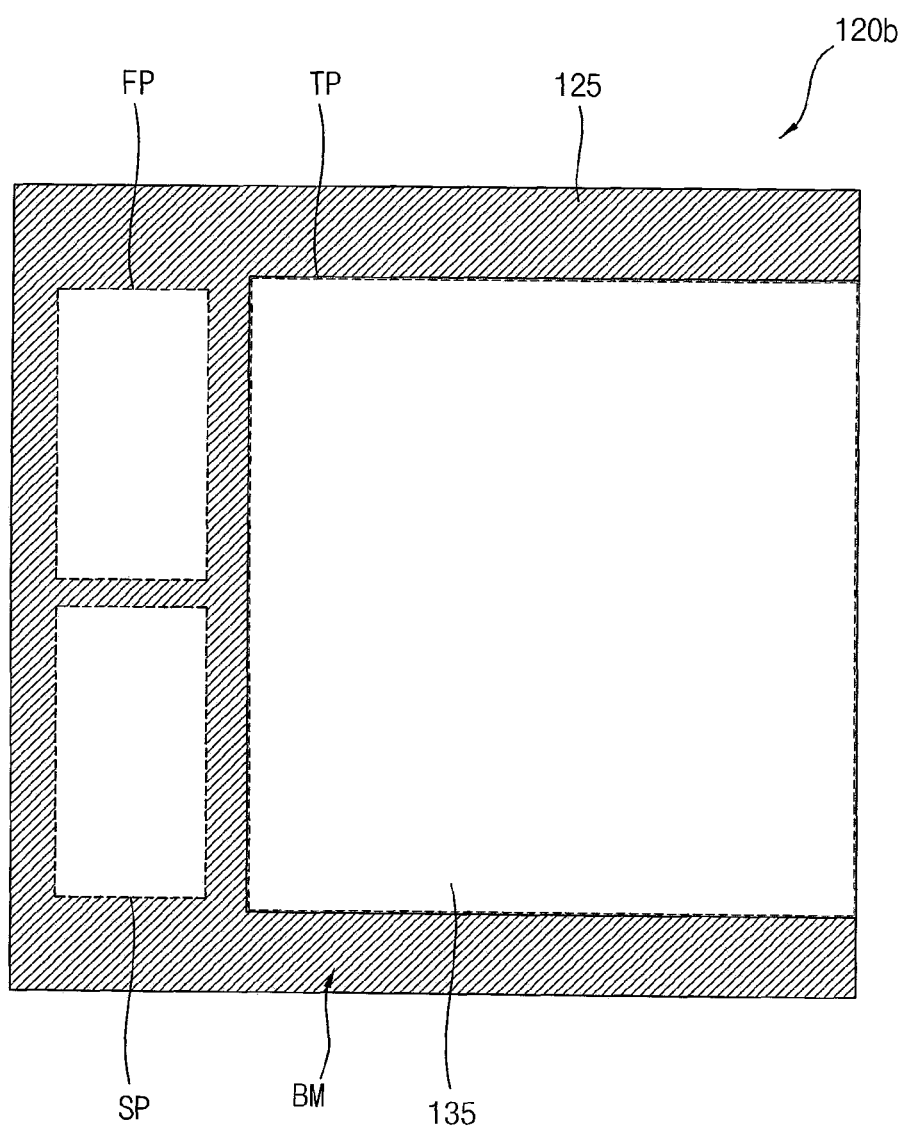
Figure 7C:
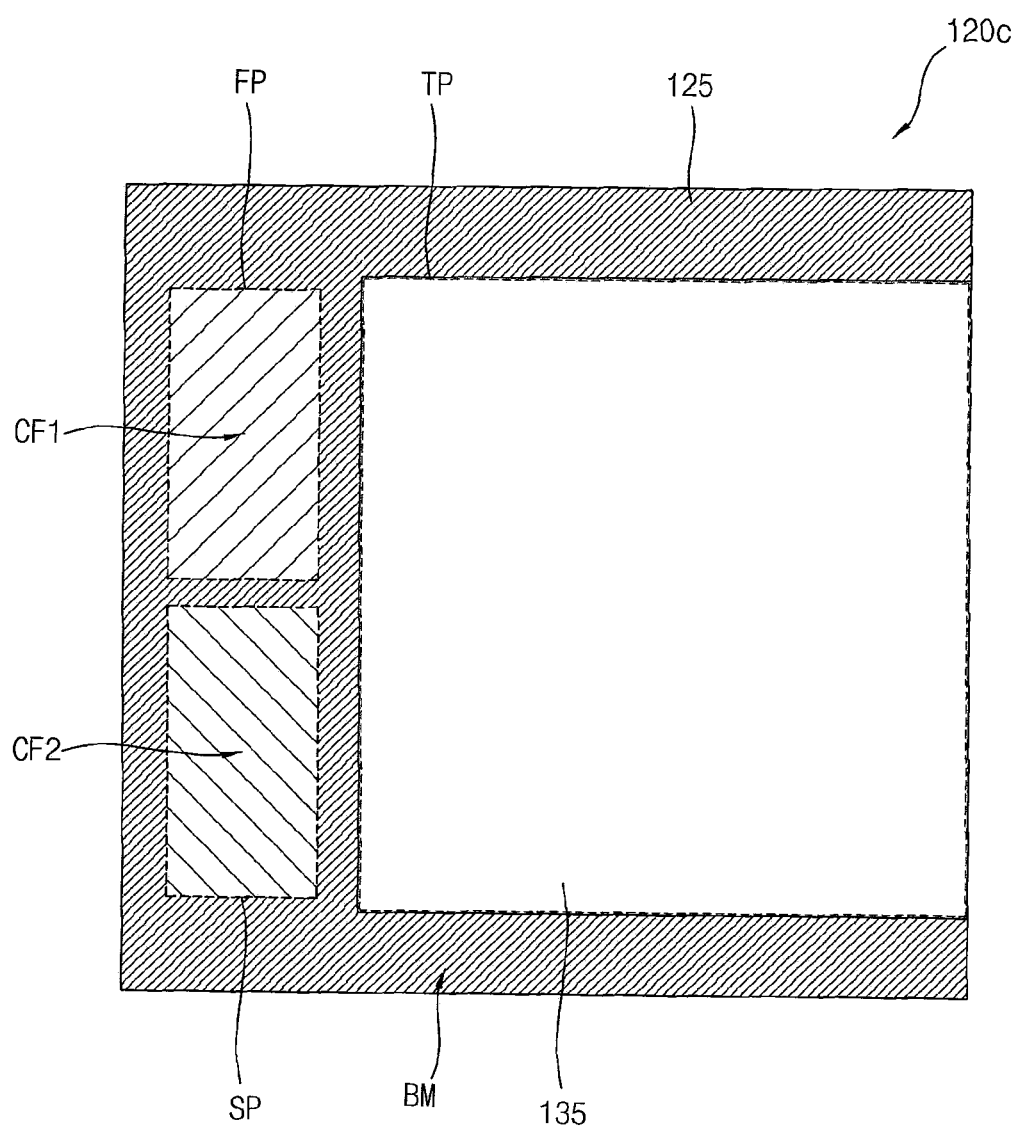

FIGS. 7A through 7C are diagrams illustrating examples in which a color filter and/or a black matrix are disposed on a non-transparent region of a unit pixel included in the transparent display panel of FIG. 1. Referring to the unit pixels 120a, 120b, and 120c shown in FIGS. 7A through 7C, color filters CF1 and CF2 that allow a specific colored light to pass through and/or a black matrix BM that prevents (or reduces) light from passing through the non-transparent region 125 may be disposed over the non-transparent region 125. The unit pixel 120a, 120b, and 120c may prevent the light from unnecessarily passing through the non-transparent region 125 by including the color filter CF1 and CF2 and/or the black matrix BM that are disposed over the non-transparent region 125.

In an example embodiment, as illustrated in FIG. 7A, in the unit pixel 120a, the color filter CF1 and CF2 may be disposed over an element region of the non-transparent region 125 in which the first and second light-emitting elements FP and SP are disposed. For example, when the first light-emitting element FP is a blue light-emitting element that generates and outputs blue light, a blue color filter CF1 may be disposed over the element region of the non-transparent region 125 in which the first light-emitting element FP is disposed. In addition, when the second light-emitting element SP is a green light-emitting element that generates and outputs green light, a green color filter CF2 may be disposed over the element region of the non-transparent region 125 in which the second light-emitting element SP is disposed. In this case, the blue light may pass through the element region of the non-transparent region 125 in which the first light-emitting element FP that outputs the blue light is disposed, but the light other than the blue light may not pass through the element region of the non-transparent region 125 in which the first light-emitting element FP that outputs the blue light is disposed. Similarly, the green light may pass through the element region of the non-transparent region 125 in which the second light-emitting element SP that outputs the green light is disposed, but the light other than the green light may not pass through the element region of the non-transparent region 125 in which the second light-emitting element SP that outputs the green light is disposed.

In another example embodiment, as illustrated in FIG. 7B, in the unit pixel 120b, the black matrix BM may be disposed over a non-element region of the non-transparent region 125 other than the element region of the non-transparent region 125 in which the first and second light-emitting elements FP and SP are disposed. In this case, lights (e.g., the first color light, the second color light, and the third color light) may not pass through the non-element region of the non-transparent region 125 other than the element region of the non-transparent region 125.

In still another example embodiment, as illustrated in FIG. 7C, in the unit pixel 120c, the color filter CF1 and CF2 may be disposed over the element region of the non-transparent region 125 in which the first and second light-emitting elements FP and SP are disposed, and the black matrix BM may be disposed over the non-element region of the non-transparent region 125 other than the element region of the non-transparent region 125 in which the first and second light-emitting elements FP and SP are disposed. In this case, the first color light may pass through the element region of the non-transparent region 125 in which the first light-emitting element FP that outputs the first color light is disposed, but the second and third color lights may not pass through the element region of the non-transparent region 125 in which the first light-emitting element FP that outputs the first color light is disposed. Similarly, the second color light may pass through the element region of the non-transparent region 125 in which the second light-emitting element SP that outputs the second color light is disposed, but the first and third color lights may not pass through the element region of the non-transparent region 125 in which the second light-emitting element SP that outputs the second color light is disposed. In addition, lights (e.g., the first color light, the second color light, and the third color light) may not pass through the non-element region of the non-transparent region 125 other than the element region of the non-transparent region 125 in which the first and second light-emitting elements FP and SP are disposed.

Figure 8:
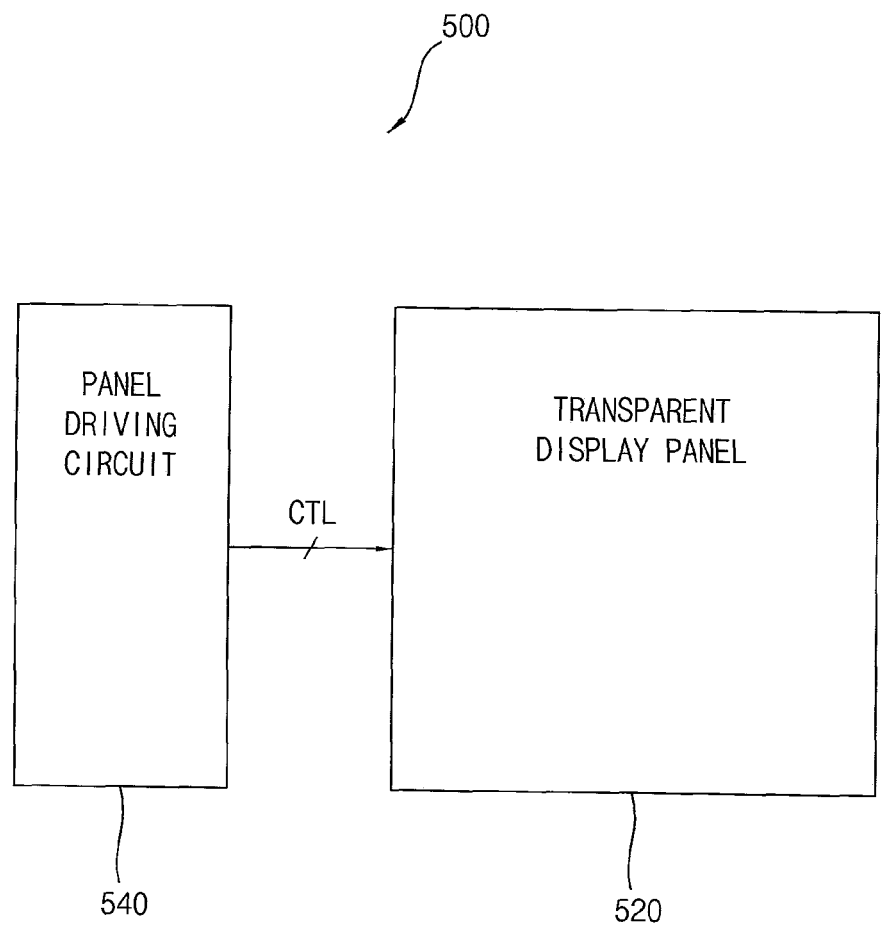
FIG. 8 is a block diagram illustrating a display device, according to an example embodiment.

FIG. 8 is a block diagram illustrating a display device, according to an example embodiment. Referring to FIG. 8, the display device 500 may include a transparent display panel 520 and a panel driving circuit 540. For example, the display device 500 may be an organic light emitting display device. However, the display device 500 is not limited to the example, and other types of display devices may be used without deviating from the scope of the present disclosure.

The transparent display panel 520 may include a plurality of unit pixels to display an image based on lights output from the unit pixels. Here, the transparent display panel 520 may allow a user to see an object located behind the transparent display panel 520 as well as the image. In an example embodiment, each unit pixel may include three individual pixels (i.e., a red light outputting pixel, a green light outputting pixel, and a blue light outputting pixel), and each individual pixel may include a light-emitting element and a circuit structure that is connected to the light-emitting element. As described above, the transparent display panel 520 may be manufactured to have a high resolution while achieving high transparency and high luminance by including the unit pixels each having a structure in which only one light-emitting element is disposed (or integrated) in a transparent region. For example, each of the unit pixels included in the transparent display panel 520 may include a non-transparent region in which a first light-emitting element that generates and outputs first color light and a second light-emitting element that generates and outputs second color light are disposed and the transparent region in which a third light-emitting element that generates and outputs third color light is disposed. For example, each of the first through third light-emitting elements included in each of the unit pixel may include an organic light emitting diode. An anode and a cathode of the third light-emitting element disposed in the transparent region may be a transparent electrode, and an anode and a cathode of the first light-emitting element disposed in the non-transparent region and an anode and a cathode of the second light-emitting element disposed in the non-transparent region may be at least one electrode selected from a non-transparent electrode, a semi-transparent electrode, a transparent electrode, and a reflective electrode.

In an example embodiment, a black matrix may be disposed over a non-element region of the non-transparent region other than an element region of the non-transparent region in which the first and second light-emitting elements are disposed. In another example embodiment, a color filter may be disposed over the element region of the non-transparent region in which the first and second light-emitting elements are disposed. In still another example embodiment, the color filter may be disposed over the element region of the non-transparent region in which the first and second light-emitting elements are disposed, and the black matrix may be disposed over the non-element region of the non-transparent region other than the element region of the non-transparent region in which the first and second light-emitting elements are disposed. Since these are described above, duplicated description related thereto may be omitted.

The panel driving circuit 540 may drive the transparent display panel 520 by providing control signals CTL to the transparent display panel 520. Specifically, the panel driving circuit 540 may include a scan driver, a data driver, and a timing controller. The scan driver may be connected to the transparent display panel 520 via scan-lines. The scan driver may provide a scan signal to the individual unit pixels of the transparent display panel 520 via the scan-lines. The data driver may be connected to the transparent display panel 520 via data-lines. The data driver may convert image data provided from the timing controller into a data signal (i.e., a data voltage) and may provide the data signal to the individual unit pixels of the transparent display panel 520 via the data-lines. The timing controller may control the scan driver, the data driver, etc. In some example embodiments, the timing controller may receive the image data from an external component, perform a specific processing (e.g., a data compensation processing) on the image data, and provide the processed image data to the data driver.

In some example embodiments, the panel driving circuit 540 may further include an emission control driver. The emission control driver may be connected to the transparent display panel 520 via emission control-lines. The emission control driver may provide an emission control signal to the individual unit pixels of the transparent display panel 520 via the emission control-lines. Although it is described above that the display device 500 includes the transparent display panel 520 and the panel driving circuit 540, and the panel driving circuit 540 includes the scan driver, the data driver, the timing controller, and the emission control driver, in some example embodiments, the display device 500 may further include other components such as a deterioration compensating circuit that performs a deterioration compensation on the individual unit pixels of the transparent display panel 520.

Figure 9:
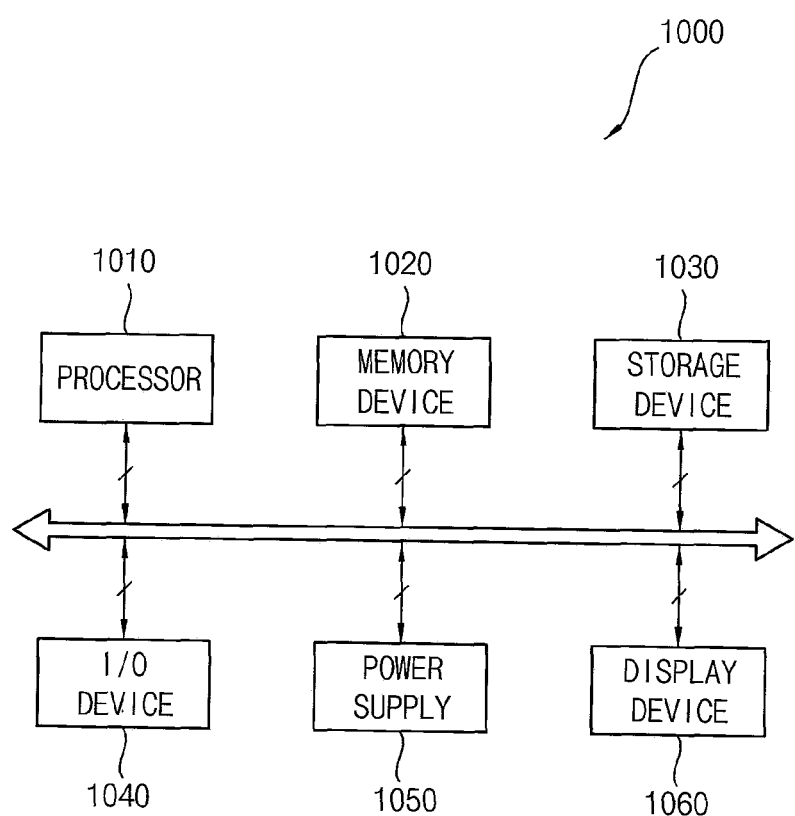
FIG. 9 is a block diagram illustrating an electronic device, according to an example embodiment.
Figure 10A:
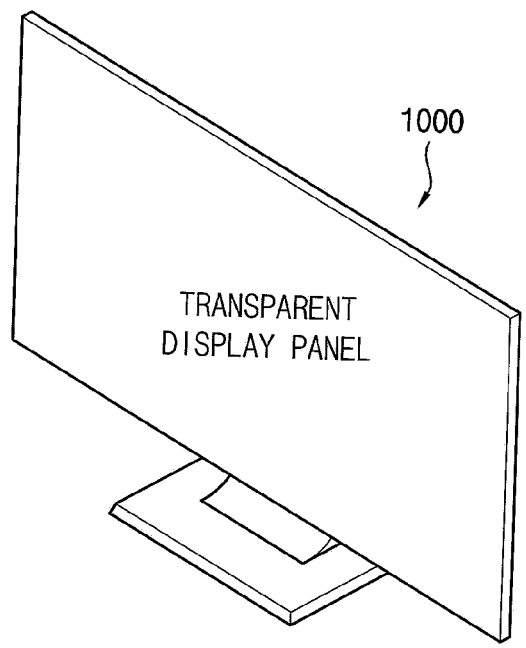
FIG. 10A is a diagram illustrating an example in which the electronic device of FIG. 9 is implemented as a television.
Figure 10B:
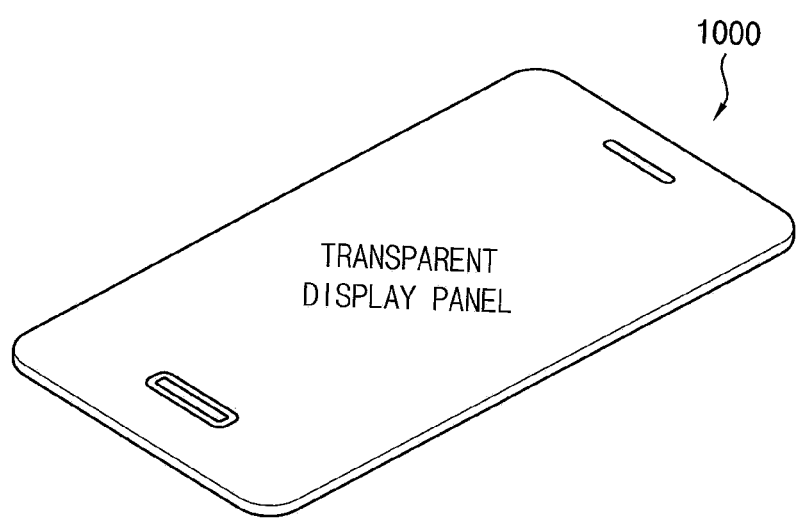
FIG. 10B is a diagram illustrating an example in which the electronic device of FIG. 9 is implemented as a smart phone.

FIG. 9 is a block diagram illustrating an electronic device, according to an example embodiment. FIG. 10A is a diagram illustrating an example in which the electronic device of FIG. 9 is implemented as a television. FIG. 10B is a diagram illustrating an example in which the electronic device of FIG. 9 is implemented as a smart phone.

Referring to FIGS. 9 through 10B, the electronic device 1000 may include a processor 1010, a memory device 1020, a storage device 1030, an input/output (I/O) device 1040, a power supply 1050, and a display device 1060. Here, the display device 1060 may correspond to the display device 500 of FIG. 8. The electronic device 1000 may further include a plurality of ports for transporting signals to and from a video card, a sound card, a memory card, a universal serial bus (USB) device, other electronic devices included in the electronic device 1000. In an example embodiment, as illustrated in FIG. 10A, the electronic device 1000 may be implemented as a television. In another example embodiment, as illustrated in FIG. 10B, the electronic device 1000 may be implemented as a smart phone. However, the electronic device 1000 is not limited to these example embodiments. For example, the electronic device 1000 may be implemented as a cellular phone, a video phone, a smart pad, a smart watch, a tablet PC, a car navigation system, a computer monitor, a laptop, a television, a head mounted display (HMD) device, etc.

The processor 1010 may perform various computing functions. The processor 1010 may be a micro processor, a central processing unit (CPU), an application processor (AP), etc. The processor 1010 may be coupled to other components via an address bus, a control bus, a data bus, etc. Further, the processor 1010 may be coupled to an extended bus such as a peripheral component interconnection (PCI) bus. The memory device 1020 may store data for operations of the electronic device 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 1030 may include a solid-state drive (SSD) device, a hard disk drive (HDD) device, a CD-ROM device, etc. The I/O device 1040 may include an input device such as a keyboard, a keypad, a mouse device, a touchpad, a touch-screen, etc, and an output device such as a printer, a speaker, etc. In some example embodiments, the display device 1060 may be included in the I/O device 1040. The power supply 1050 may provide power for operations of the electronic device 1000.

The display device 1060 may be coupled to other components via the buses or other communication links. The display device 1060 may include a transparent display panel and a panel driving circuit that drives the transparent display panel. The display device 1060 may allow a user to see an object located behind the transparent display panel as well as an image displayed by the transparent display panel. As described above, the transparent display panel may include unit pixels each having a structure in which only one light-emitting element is disposed (or integrated) in a transparent region. The transparent display panel may be manufactured to have a high resolution while achieving high transparency and high luminance, and the display device 1060 including the transparent display panel may provide a high-quality image.

Each of unit pixels included in the transparent display panel may include a non-transparent region in which a first light-emitting element that generates and outputs first color light and a second light-emitting element that generates and outputs second color light are disposed and a transparent region in which a third light-emitting element that generates and outputs third color light is disposed. For example, each of the first through third light-emitting elements included in each of the unit pixels may include an organic light emitting diode. An anode and a cathode of the third light-emitting element disposed in the transparent region may be a transparent electrode. An anode and a cathode of the first light-emitting element disposed in the non-transparent region and an anode and a cathode of the second light-emitting element disposed in the non-transparent region may be at least one electrode selected from a non-transparent electrode, a semi-transparent electrode, the transparent electrode, and a reflective electrode.

In an example embodiment, a black matrix may be disposed over a non-element region of the non-transparent region other than an element region of the non-transparent region in which the first and second light-emitting elements are disposed. In another example embodiment, a color filter may be disposed over the element region of the non-transparent region in which the first and second light-emitting elements are disposed. In still another example embodiment, the color filter may be disposed over the element region of the non-transparent region in which the first and second light-emitting elements are disposed, and the black matrix may be disposed over the non-element region of the non-transparent region other than the element region of the non-transparent region in which the first and second light-emitting elements are disposed. Since these are described above, duplicated description related thereto may be omitted.

The present inventive concept may be applied to a display device including a transparent display panel and an electronic device including the display device. For example, the present inventive concept may be applied to a cellular phone, a smart phone, a video phone, a smart pad, a smart watch, a tablet PC, a car navigation system, a television, a computer monitor, a laptop, a head mounted display device, etc.

The foregoing is illustrative of example embodiments and is not to be construed as limiting thereof. Although some example embodiments have been described, those skilled in the art will readily appreciate that many modifications and deviations are possible in the example embodiments without materially departing from the novel teachings and advantages of the present inventive concept. Accordingly, such modifications and deviations are intended to be included within the scope of the present inventive concept. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the present inventive concept.

What is claimed is:

1. A transparent display panel comprising:
a plurality of unit pixels,
wherein each of the unit pixels is divided into a non-transparent region and a transparent region and includes three distinctive light-emitting elements including a first light-emitting element that emits first color light, a second light-emitting element that emits second color light, and a third light-emitting element that emits third color light, the first color, the second color, and the third color being different from one another,
wherein the non-transparent region includes the first light-emitting element and the second light-emitting element among the three distinctive light-emitting elements,
wherein the transparent region includes the third light-emitting element among the three distinctive light-emitting elements,
wherein the third color light outputted through the transparent region is one of a red light, a green light, and a blue light,
wherein the transparent region displays an image based on only the third color light among the first color, the second color, and the third color while allowing a user to see an object located behind the transparent display panel through the transparent region that displays the image based only on the third color light, and
wherein each of the first light-emitting element and the second light-emitting element is arranged to be separated from the third light-emitting element with no light-emitting element interposed therebetween.

2. The transparent display panel of claim 1, wherein each of the first light-emitting element, the second light-emitting element, and the third light-emitting element includes an organic light emitting diode.

3. The transparent display panel of claim 2, wherein an anode and a cathode of the third light-emitting element are a transparent electrode.

4. The transparent display panel of claim 3, wherein an anode of the first light-emitting element and an anode of the second light-emitting element are a non-transparent electrode, a semi-transparent electrode, the transparent electrode, or a reflective electrode, and
wherein a cathode of the first light-emitting element and a cathode of the second light-emitting element are the non-transparent electrode, the semi-transparent electrode, or the transparent electrode.

5. The transparent display panel of claim 3, wherein an anode of the first light-emitting element and an anode of the second light-emitting element are a non-transparent electrode, a semi-transparent electrode, or the transparent electrode, and
wherein a cathode of the first light-emitting element and a cathode of the second light-emitting element are the non-transparent electrode, the semi-transparent electrode, the transparent electrode, or a reflective electrode.

6. The transparent display panel of claim 1, wherein an area of the transparent region is larger than an area of the non-transparent region.

7. The transparent display panel of claim 6, wherein an area of the third light-emitting element is equal to the area of the transparent region.

8. The transparent display panel of claim 6, wherein an area of the third light-emitting element is larger than an area of the first light-emitting element and an area of the second light-emitting element.

9. The transparent display panel of claim 6, wherein an organic layer of the third light-emitting element is thinner than an organic layer of the first light-emitting element and an organic layer of the second light-emitting element.

10. The transparent display panel of claim 1, wherein the third color light is the blue light, the first color light is the red light, and the second color light is the green light.

11. The transparent display panel of claim 1, wherein the third color light is the red light, the first color light is the blue light, and the second color light is the green light.

12. The transparent display panel of claim 1, wherein the third color light is the green light, the first color light is the blue light, and the second color light is the red light.

13. The transparent display panel of claim 1, wherein a black matrix is disposed over a non-element region of the non-transparent region other than an element region of the non-transparent region in which the first light-emitting element and the second light-emitting element are disposed.

14. The transparent display panel of claim 1, wherein a color filter is disposed over an element region of the non-transparent region in which the first light-emitting element and the second light-emitting element are disposed.

15. The transparent display panel of claim 1, wherein a color filter is disposed over an element region of the non-transparent region in which the first light-emitting element and the second light-emitting element are disposed, and a black matrix is disposed over a non-element region of the non-transparent region other than the element region of the non-transparent region.

16. The transparent display panel of claim 1, wherein the first light-emitting element is disposed at a side of the third light-emitting element in a first direction, and the second light-emitting element is disposed at a side of the third light-emitting element in a second direction that is perpendicular to the first direction.

17. The transparent display panel of claim 1, wherein the first light-emitting element and the second light-emitting element are disposed together at a side of the third light-emitting element or are disposed respectively at opposite sides of the third light-emitting element.

18. A display device comprising:
a transparent display panel including a plurality of unit pixels; and
a panel driving circuit configured to drive the transparent display panel,
wherein each of the unit pixels is divided into a non-transparent region and a transparent region and includes three distinctive light-emitting elements including a first light-emitting element that emits first color light, a second light-emitting element that emits second color light, and a third light-emitting element that emits third color light, the first color, the second color, and the third color being different from one another,
wherein the non-transparent region includes the first light-emitting element and the second light-emitting element among the three distinctive light-emitting elements,
wherein the transparent region includes the third light-emitting element among the three distinctive light-emitting elements,
wherein the third color light outputted through the transparent region is one of a red light, a green light, and a blue light, wherein the transparent region displays an image based on only the third color light among the first color, the second color, and the third color while allowing a user to see an object located behind the transparent display panel through the transparent region that displays the image based only on the third color light, and wherein each of the first light-emitting element and the second light-emitting element is arranged to be separated from the third light-emitting element with no light-emitting element interposed therebetween.

\* \* \* \* \*